United States Patent
Nagashima et al.

(10) Patent No.: US 9,387,960 B2
(45) Date of Patent: Jul. 12, 2016

(54) SUBSTRATE STORING CONTAINER

(75) Inventors: Tsuyoshi Nagashima, Tokyo (JP); Shuichi Inoue, Tokyo (JP); Takaharu Oyama, Tokyo (JP); Chiaki Matsutori, Kumamoto (JP); Kazumasa Ohnuki, Saitama (JP); Hiroyuki Shida, Saitama (JP); Hiroki Yamagishi, Saitama (JP)

(73) Assignees: Miraial Co., Ltd., Tokyo (JP); Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 14/131,120

(22) PCT Filed: Jul. 3, 2012

(86) PCT No.: PCT/JP2012/066989
§ 371 (c)(1),
(2), (4) Date: Jan. 6, 2014

(87) PCT Pub. No.: WO2013/005740
PCT Pub. Date: Jan. 10, 2013

(65) Prior Publication Data
US 2014/0138279 A1 May 22, 2014

(30) Foreign Application Priority Data
Jul. 6, 2011 (JP) ................................. 2011-150284

(51) Int. Cl.
*B65D 43/02* (2006.01)
*H01L 21/673* (2006.01)

(52) U.S. Cl.
CPC .......... *B65D 43/02* (2013.01); *H01L 21/67373* (2013.01)

(58) Field of Classification Search
CPC ....................................................... B65D 43/02
USPC .................. 206/710–712, 1.5, 715; 220/326; 70/209
See application file for complete search history.

(56) References Cited

U.S. PATENT DOCUMENTS 4,727,984 A * 3/1988 Bennardo ....................... 206/1.5
4,995,430 A 2/1991 Bonora et al.
(Continued)

FOREIGN PATENT DOCUMENTS

| EP | 1993 125 | * | 6/2004 | ............ H01L 21/673 |
| JP | 8-191100 A | | 7/1996 | |

(Continued)

OTHER PUBLICATIONS

International Search Report issued in PCT/JP2012/066989 mailed on Aug. 7, 2012 (2 pages).
(Continued)

*Primary Examiner* — Anthony Stashick
*Assistant Examiner* — Raven Collins
(74) *Attorney, Agent, or Firm* — Osha Liang LLP

(57) ABSTRACT

A substrate storing container includes: a container body for storing semiconductor wafers; a door that is fitted to the front of the container body; and a locking mechanism locking the door. The locking mechanism includes: a rotary driver that is supported by the door and operated from a cover plate side; and a locking bar that vertically slides as the rotary driver rotates to bring the distal end into, and out of, a locking hollow of the container body. The rotary driver is separated into first and second rotary drivers. The first and second rotary drivers are formed with first and second cam portions, respectively. The first and second cam portions are made to support the proximal end of the locking bar therebetween so that the locking bar can sway in the thickness direction of the door.

6 Claims, 14 Drawing Sheets

(56) References Cited

U.S. PATENT DOCUMENTS

| | | | | |
|---|---|---|---|---|
| 5,957,292 | A | * | 9/1999 | Mikkelsen ........ H01L 21/67373 206/454 |
| 6,955,382 | B2 | | 10/2005 | Eggum |
| 7,624,861 | B2 | * | 12/2009 | Lax et al. .................... 206/308.2 |
| 2003/0137151 | A1 | | 7/2003 | Eggum |
| 2009/0026109 | A1 | * | 1/2009 | Hasegawa et al. ............ 206/711 |

FOREIGN PATENT DOCUMENTS

| | | |
|---|---|---|
| JP | 2001-512288 A | 8/2001 |
| JP | 2003-133405 A | 5/2003 |
| JP | 2005/101518 A | 4/2005 |
| JP | 2005-515620 A | 5/2005 |
| JP | 2007/019328 A | 1/2007 |
| JP | 2007/191205 A | 8/2007 |
| JP | 2008-098236 A | 4/2008 |
| JP | 2010-010598 A | 1/2010 |
| WO | 03/010069 A1 | 2/2003 |

OTHER PUBLICATIONS

Office Action in corresponding Taiwanese Patent Application No. 101124268 dated Sep. 23, 2015 (8 pages).

* cited by examiner

SUBSTRATE STORING CONTAINER

TECHNICAL FIELD

The present invention relates to a substrate storing container that stores, preserves, transports and ships substrates such as semiconductor wafers, glass wafers and glass masks, more detailedly relating to improvement of a locking mechanism for a door fitted to the opening of a container body.

BACKGROUND ART

Though not illustrated, a conventional substrate storage container includes a container body for accommodating semiconductor wafers, a door that is detachably attached to open and close the open front of this container body, and a locking mechanism for locking the door fitted to the front of the container body, the locking mechanism being provided in the door (see Patent Documents 1, 2, 3 and 4).

For example, the container body is formed of a predetermined molding material and given in the form of a front-open box for accommodating a plurality of semiconductor wafers in vertical alignment while locking holes for a locking mechanism are formed at right and left positions on both the upper and the lower inner peripheral part in the front. On the other hand, the door is formed with such dimensions that the thickness is specified in conformity with the global standards, i.e., the SEMI Standards while retraction holes for the locking mechanism are formed at the positions opposing the corresponding locking holes of the container body. The door is fitted to, or removed from, the open front of the container body by means of door opening and closing equipment which holds the door by vacuum suctioning.

There are various types of locking mechanisms. A type disclosed in Patent Document 1 is formed of, for example, a plurality of cam plates that are operated to rotate from the outside of the door by means of door opening and closing equipment, and a plurality of latch bars that slide into, and out of, locking holes of the container body as each cam plate rotates. These plural cam plates and latch bars are separately formed of predetermined molding materials, and the latch bar is connected to either the front or rear face of the cam plate while inclined projections for the latch bar are projectively formed on the front side of the cam plate.

The locking mechanism of a type disclosed in Patent Document 2 is formed of a plurality of cam plates that are operated to rotate from the outside of the door, and a plurality of latch bars that are coupled with each cam plate via a cam follower at the end thereof and move into and separate from locking holes of the container body. These plural cam plates and latch bars are separately formed of predetermined materials. An inclined projection as a three-dimensional cam for the latch bar is projectively formed on the front side of the cam plate while the cam follower of the latch bar is formed in an approximately S-curved shape.

The locking mechanism of a type disclosed in Patent Document 3 basically has the same configuration as the above types, being formed of molded multiple cam plates in combination with latch bars. However, a protruded lip for the latch bar is formed at the peripheral part of the cam plate while the end of the latch bar is not formed linearly but is formed into two branches.

The locking mechanism of a type disclosed in Patent Document 4 is formed of a plurality of rotary plates that are operated to rotate from the outside of the door by means of door opening and closing equipment, a plurality of vertically and retractable connection bars with their connection pins inserted in circular arc slots that are cut out through the peripheral part of each rotary plate, and a plurality of locking claws that sway to come out from the retraction holes of the door and enter the locking holes of the container body as each connection bar moves outwards. The plural rotary plates, connection bars and locking claws are separately formed of predetermined molding materials. The locking claw is pivotably supported by means of multiple durable metallic pins in the interior part of the retraction hole and the front end of the connection bar.

With the thus configured substrate storing container, the door is fitted shallowly to the open front of the container body by means of door opening and closing equipment so that the front side of the door is more or less projected outside the front face of the container body (the door is made to stop at a position 3 mm to the front side from the locking holes of the container body, or in a state of it being not completely fitted), then the locking mechanism is operated by means of door opening and closing equipment so that the distal ends or locking claws of the latch bars are engaged into the locking holes of the container body while the door that has been shallowly fitted inside the front of the container body is drawn deeply therein, whereby the door is correctly fitted to the front of the container body and firmly locked.

In locking this door, the distal end of the latch bar or the locking claw comes in slight contact with the wall surface on the front side that defines the locking hole, in the stage where the front side of the door is more or less projected outward relative to the front of the container body. Then, as the latch end or the locking claw is slid and obliquely and deeply inserted into the locking hole and engaged, whereby the door is sufficiently pulled in until the front face of the door is flush with the front face of the container body.

BRIEF DESCRIPTION OF DRAWINGS

Prior Art Documents

Patent Documents

Figure 1:
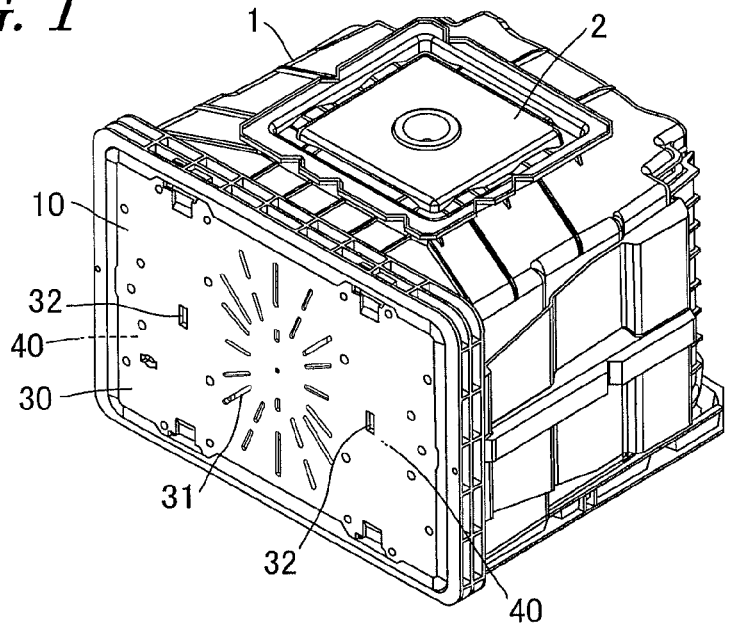

Patent Document 1:
  Japanese Patent Application Laid-open No. 2005-101518
Patent Document 2:
  Japanese Patent Publication No. 2001-512288
Patent Document 3:
  Japanese Patent Application Laid-open No. 2003-133405
Patent Document 4:
  Japanese Patent Publication No. 2005-515620

SUMMARY OF THE INVENTION

Problems to be Solved by the Invention

As described above, in the conventional substrate storing containers, the end of the latch bar is simply connected to the cam plate of the locking mechanism, or the connection pins of the connection bar are merely fitted to, and pivotally supported by, the circular arc slot of the rotary plate, so that these structures are relatively easily disengaged. As a result, there occurs the problem that, when, for example, a strong impact acts on the locking mechanism due to falling or the like, the locking mechanism is unlocked, leading to damage to the semiconductor wafers or leading to semiconductor wafer pollution due to inflow of air from the outside.

Further, since the door is drawn into place by deeply inserting the distal end of the latch bar or the locking claw of the locking mechanism into the locking hole after slightly touching the wall surface on the front side that defines the locking hole, there is a fear that the locking action becomes unstable and causes damage to the locking hole and locking claw. Further, there is a possibility that the amount of the door being drawn in is not assured sufficiently.

Moreover, since the distal end of the latch bar or the locking claw is obliquely inserted whilst sliding along the interior of the locking hole, if an excessive locking force acts on the locking mechanism, there is a risk that sliding contact may generate particles and deform the distal end of the latch bar or the locking claw. As this oblique movement of insertion is realized by virtue of the inclination projection of the cam plate, realizing this action needs a complicated structure for connection between the inclined projection of the cam plate and the latch bar. As result, this makes difficult the task for forming the cam plate and latch bar with high precision and delays and complicates assembly of the locking mechanism.

Further more, when the locking mechanism is a type that is formed of multiple rotary plates, connection bars and locking claws, parts increase in number. As a result, there occurs the problem that the locking mechanism cannot be assembled quickly. Due to the arrangement in which the locking claw is pivotally supported at the interior of the retraction hole of the door and at the front end of the connection bar, the strength of the retraction hole is lowered, so that there is a fear that the door is deformed so as to enlarge the opening of the retraction hole and that the connection bar is also deformed at the time of locking. Moreover, as the locking claw is supported pivotally by multiple small metallic pins, it is necessary to insert them so that each metal pin will not dislodge. As a result, there is the problem that quick assembly work cannot be expected.

The present invention has been devised in view of the above, it is therefore an object of the present invention to provide a substrate storing container that can eliminate the fear of damage to, and deformation of, substrates, the door and the locking mechanism, can stabilize the locking operation of the locking mechanism and assure a sufficient amount of the door being drawn in, can simplify the locking mechanism structure so as to realize quick assembly, and can prevent the locking mechanism from being unlocked as a result of dislodging at the coupling part between the rotary driver and the locking bar and other reasons, caused by some impact or the like.

Means for Solving the Problems

According to the present invention, in order to solve the above problems, a substrate storing container comprising: a container body for storing substrates; a door that is fitted to an opening of the container body; and a locking mechanism for locking the door fitted to the opening of the container body, characterized in that the locking mechanism includes a rotary driver that is operated from an outside of the door and a locking bar that slides as the rotary driver rotates to bring a distal end into and out of a locking hollow in an inner periphery of the opening of the container body while the rotary driver is separated into first and second rotary drivers, whose opposing sides are formed with first and second cam portions, respectively, the first and second cam portions are made to support the locking bar in a swayable manner, and, when the door is locked, the rotary driver is rotated in a locking direction to cause the first and second cam portions to follow the locking bar so as to project the distal end of the locking bar out of the door into the locking hollow of the container body in a substantially non-contacting manner and then move the locking bar in a thickness direction of the door, thereby bringing the distal end into contact with a wall surface forming the locking hollow.

Herein, it is possible that the door includes: a door main part fitted to the opening of the container body; and a cover plate that covers an opening side of the door main part, and a rotation limiting member for the rotary driver of the locking mechanism is provided either on the door main body or the cover plate, and a retraction hole for the locking bar that opposes the locking hollow of the container body is formed on a peripheral wall of the door main part.

Also, it is possible that the door is built in with a guiding projection for the locking bar of the locking mechanism while a support point is formed in the locking bar at a position opposing a guiding projection, and the distal end of the locking bar is tilted in the thickness direction of the door, using the contact point between the guiding projection and support point as a fulcrum.

It is also possible that the door main body of the door is formed with a supporting member for supporting the rotary driver, and a plurality of positioning projections different in length are formed on the peripheral surface of the supporting member, and a long positioning projection is formed to have approximately a same length as a height of the supporting member while a short positioning projection is formed to have a length shorter than the height of the supporting member.

It is also possible that the first rotary driver includes: a disc that is built in the door main body of the door and arranged to oppose the cover plate; and a cylindrical member provided on the opposing side of the disc opposing the second rotary driver, and the disc has an operation hole formed in a center thereof so as to oppose a key slot of the cover plate, and an engaging portion for the locking bar is formed near the periphery thereof while the cylindrical member is formed in such a manner that an inner peripheral surface of the cylindrical member comes into contact with only the long positioning projection out of multiple positioning projections and that a first positioning portion is provided on a peripheral wall of the cylindrical member, and the second rotary driver includes: a cylindrical member fitted on the cylindrical member of the first rotary driver; and an outside flange projecting out from the cylindrical member, and the cylindrical member has an inside flange formed so as to come into contact with the multiple positioning projections of the supporting member, the inside flange being formed with a second positioning portion that mates with the first positioning portion of the first rotary driver, and a proximal end of the locking bar is held between the first and second cam portions in a swayable manner, and a fitting portion which is slidably fitted to the engaging portion of the first rotary driver is provided at the proximal end of the locking bar.

Father, it is possible that the first cam portion includes: a first flat cam surface that is formed on the opposing side of the disc of the first rotary driver and is adjacent to the engaging portion; a first inclined cam surface that is formed along the peripheral side of the engaging portion and becomes gradually higher from one end to other end of the engaging portion; and a first engaging cam surface formed in a vicinity of other end of the periphery of the engaging portion and integrated with the first inclined cam surface, and the first cam portion is formed in such a manner that a lowest portion of the first inclined cam surface is positioned in a vicinity of a point of flexion of the engaging portion while a highest point is positioned in a vicinity of the other end of the engaging portion, and the first engaging cam surface is formed to have approximately the same height as height of a highest portion of the first inclined cam surface, and, the second cam portion includes: a second flat cam surface that is formed on one end side of the outside flange of the second rotary driver; a second inclined cam surface that is connected to the end of the second flat cam surface and gradually changes in height as it goes in the circumferential direction of the cylindrical member; and a second engaging cam surface that is formed on the other end side of the outside flange and formed contiguous to the end of the second inclined cam surface, and a protruding amount gradually becomes smaller as it goes from the second inclined cam surface to the second engaging cam surface.

Herein, the substrates in the scope of claims, at least, include a predetermined number of semiconductor wafers (e.g., silicon wafers of 300 mm or 400 mm in diameter and others), glass wafers and glass masks. The container body may be either a front open type or a top open type. Support members provided for the door main part of the door may be cylindrical ribs or may have a configuration formed by dividing a cylinder into multiple parts.

The locking mechanism preferably has a mechanism for locking the door by two steps, namely the first half stage and the second half stage. The number of rotary drivers in this locking mechanism should not be particularly limited and may be either singular or plural. As the first and second positioning portions in the first and second rotary drivers, at least, a depression, cutout and projection, projecting piece may be considered. As the engaging portion of the first rotary driver, at least, a curved perforated slot, depression, various types of cam structures may be included. The locking bar is given in the form of a plate, rod or the like, and the number of the locking bars may be varied depending on the number of the rotary drivers. It is preferable that the proximal end has an approximately T-shape in a side view. The fitting part of this locking bar may be provided in the form of a projection, a pin, or a roller rotatably fitted to a projection.

Further, when the locked door is unlocked in the locking mechanism, the rotary driver is rotated in the unlocking direction so as to make the first and second cam portions follow the locking bar, whereby it is possible to tilt the locking bar from the door's cover plate side to the door main part side so as to separate the distal end from the opening side-wall surface forming the locking hollow, then retract the distal end of the locking bar from the locking hollow of the container body into the door interior without any contact.

According to the present invention, when the door is fitted and locked to the opening of the container body, the door is shallowly fitted to the opening of the container body first with its front side slightly projected outside from the container body. Upon this, since the locking bar is supported between the first flat cam surface of the first cam portion and the second engaging cam surface of the second cam portion in the locking mechanism, so that the proximal end as the engaging portion of the locking bar is located on the front side of the door while the distal end of the locking bar is located on the opposite side.

As the rotary driver of the locking mechanism is operated from the outside of the door and turned in the locking direction by a predetermined rotational angle from the above situation, the locking bar moves between first and second cam portions while the proximal end, as the engaging portion of the locking bar, is supported between the inclined cam surfaces of the first and second cam portions, so that the distal end of the locking bar projects from the door into the locking hollow of the container body without any contact.

When the rotary driver further turns by a predetermined rotational angle in the locking direction, the proximal end of the locking bar is supported between the first engaging cam surface of the first cam portion and the second flat cam surface of the second cam portion. As a result, the projected distal end of the locking bar moves to the front-side direction of the door so that this distal end comes in contact with the wall surface on the opening side of the locking hollow. This contact causes the door fitted shallowly in the opening of the container body to be drawn in deeply, whereby the door can be fitted and locked appropriately and firmly.

Effect of the Invention

According to the present invention, it is possible to have the effect of eliminating the risk of damage to, and deformation of, substrates, the door and the locking mechanism. Further, since the engaging portion of the locking bar is held between first and second rotary drivers, it is possible, to provide the effect that when the locking mechanism is either locked or unlocked, it is possible to prevent wobbling between the engaging portion of the rotary driver and the engaging portion of the locking bar, stabilize the locking operation and unlocking operation and assure a sufficient amount of drawing of the door. Moreover, it is possible to simply the configuration of the locking mechanism and hence speed up assembly. Furthermore, since the engaging portion of the locking bar is held between first and second rotary drivers, it is possible to make the rotary driver and the locking bar unlikely to disengage, hence prevent the locking mechanism from being unlocked if, for example, an impact force acts.

According to the invention of Claim 2, it is possible to control rotation of the rotary driver by making the rotation limiting member interfere with the rotary driver. Further, it is possible for the retraction hole of the door main part to guide the distal end of the locking bar smoothly and project it out and to retract the dispel end of the locking bar from the outside of door into the interior without a hindrance.

According to the invention of Claim 3, since the contact portion between the guide rib and the support point is used as a fulcrum of the locking bar, the distal end of the locking bar can be easily tilted to the door's cover plate direction or the door main part direction.

According to the invention of Claim 4 or 5, the supporting member supports the rotary driver, it is possible to rotate the rotary driver in the locking direction and in the unlocking direction without inducing wobbling and displacement. Further, since the cylindrical member only comes in contact with the long positioning projections among the multiple positioning projections, it is possible for the first rotary driver to rotate greater in the lateral direction than in the vertical direction.

Accordingly, even if the operation hole of the first rotary driver is located out of the normal position relative to the operation key of the locking mechanism, the position of the operation hole can be corrected by making it follow the operation key to thereby allow the operation key to correctly fit into the operation hole. Further, since the first and second positioning portions interfere with each other, it is possible to expect to rotate the first and second rotary drivers, not separately but together, at the time of locking or unlocking the locking mechanism.

According to the invention of Claim 6, since the first flat cam surface of the first cam portion and the second engaging cam surface of the second cam portion hold the proximal end of the locking bar therebetween in the stage before the locking operation, it is possible to position the distal end of the locking bar to the door main part side. Further, since the inclined cam surfaces of the first and second cam portions hold the proximal end of the locking bar therebetween in the first half stage of the locking operation, it is possible to position the distal end of the locking bar to the door's cover plate side. Moreover, since the engaging cam surface of the first cam portion and the second flat cam surface of the second cam surface hold the proximal end of the locking bar therebetween in the second half stage of the locking operation, it is possible to tilt the distal end of the locking bar to the door's cover plate side.

BRIEF DESCRIPTION OF THE DRAWINGS

FIG. 1 is an overall perspective view schematically showing an embodiment of a substrate storing container according to the present invention.

Figure 2:
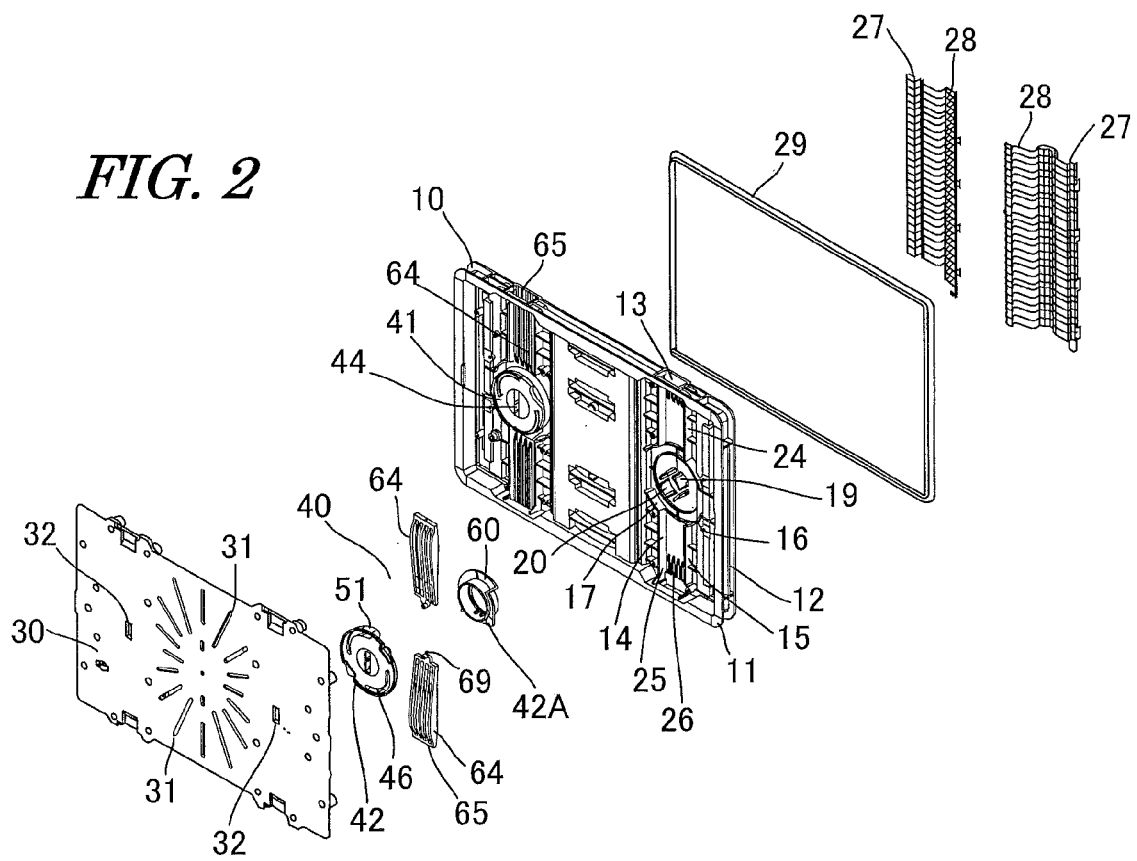

FIG. 2 is an exploded perspective view schematically showing a door and a locking mechanism in an embodiment of a substrate storing container according to the present invention.

Figure 3:
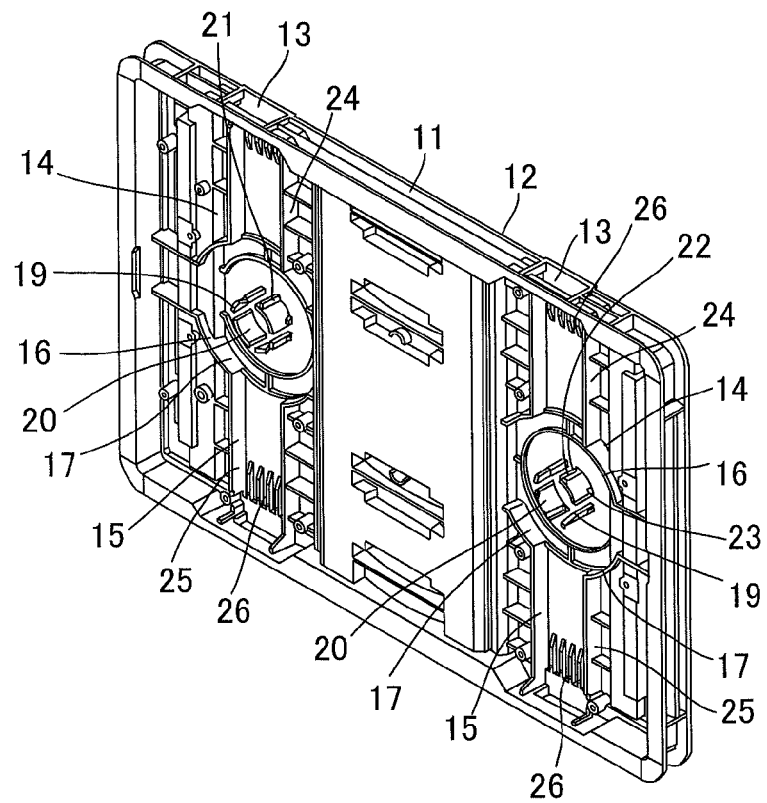

FIG. 3 is a perspective illustrative view schematically showing a door main part in an embodiment of a substrate storing container according to the present invention.

Figure 4:
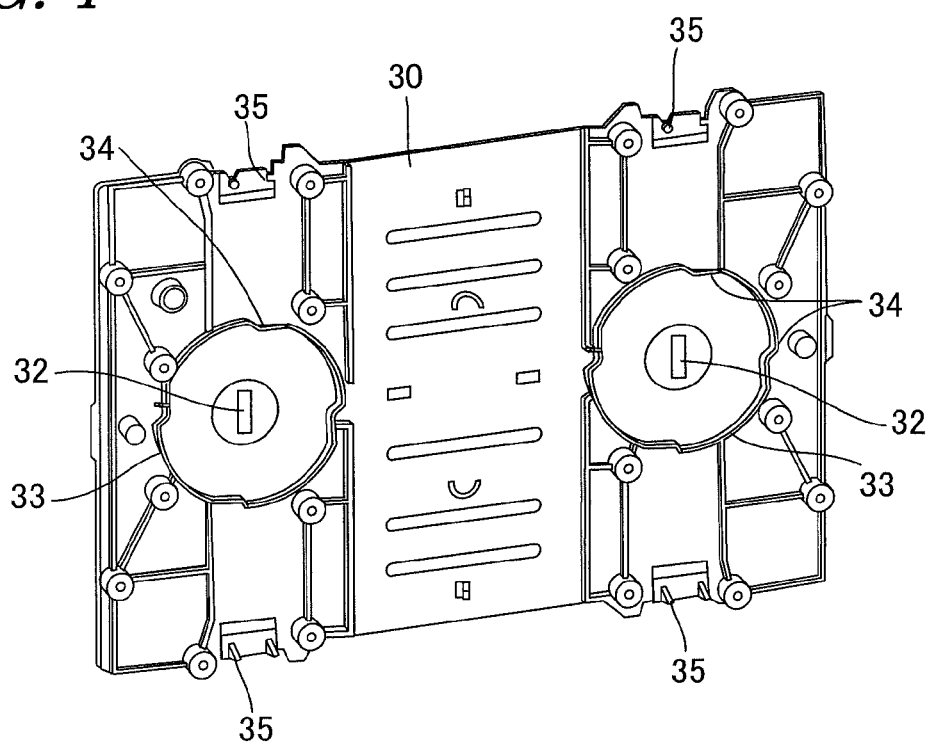

FIG. 4 is a perspective illustrative view schematically showing the rear side of a cover plate in an embodiment of a substrate storing container according to the present invention.

Figure 5:
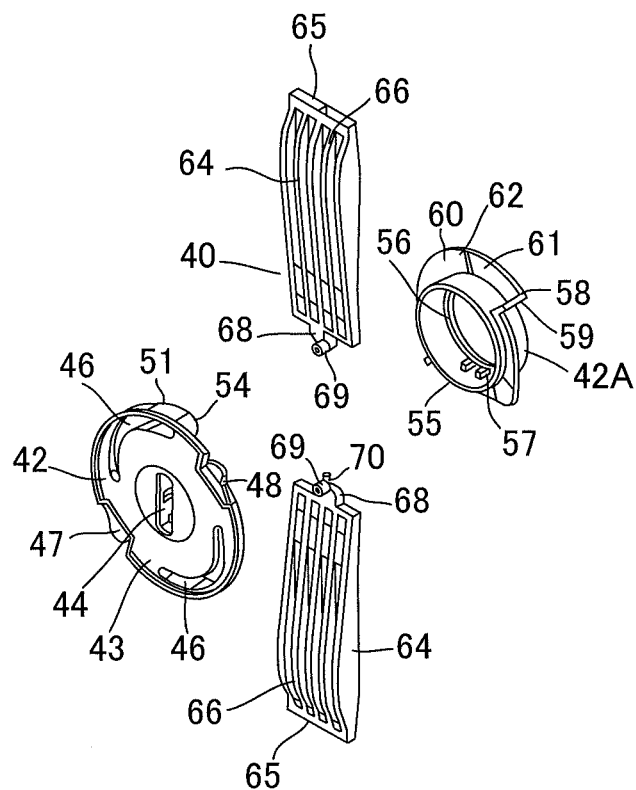

FIG. 5 is an exploded perspective view schematically showing a locking mechanism in an embodiment of a substrate storing container according to the present invention.

Figure 6:
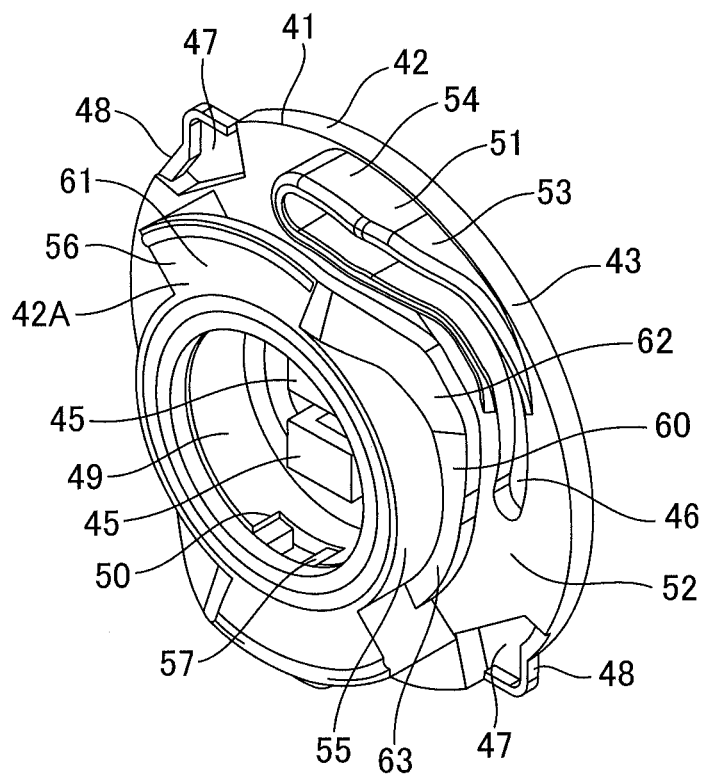

FIG. 6 is a perspective illustrative view schematically showing a rotary driver in an embodiment of a substrate storing container of the present invention.

Figure 7:
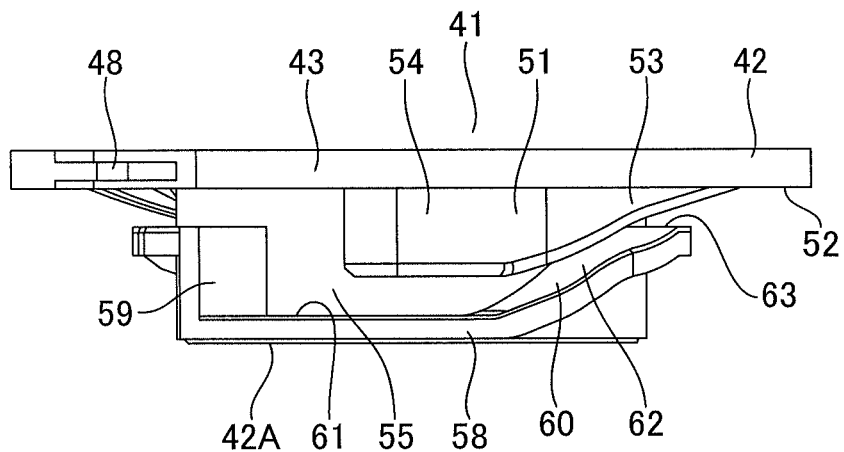

FIG. 7 is a side illustrative view schematically showing a rotary driver in an embodiment of a substrate storing container of the present invention.

Figure 8:
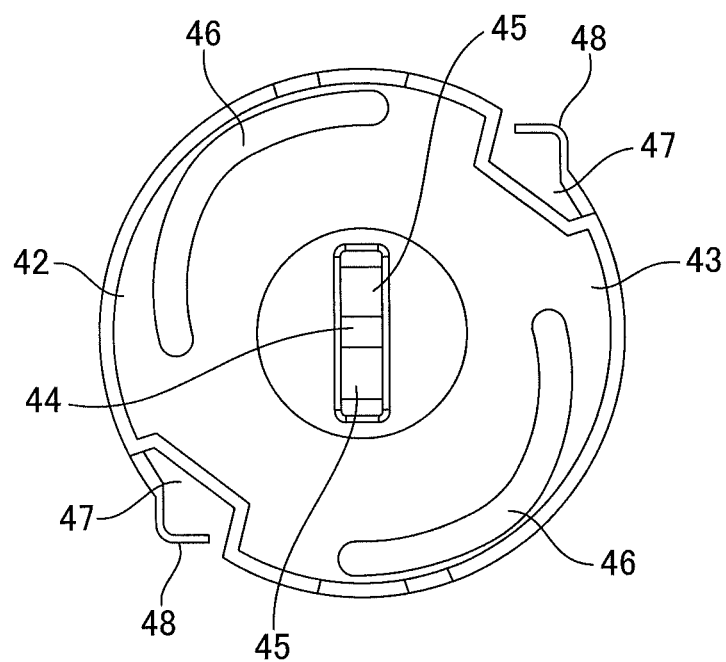

FIG. 8 is a front side illustrative view schematically showing a first rotary driver in an embodiment of a substrate storing container according to the present invention.

Figure 9:
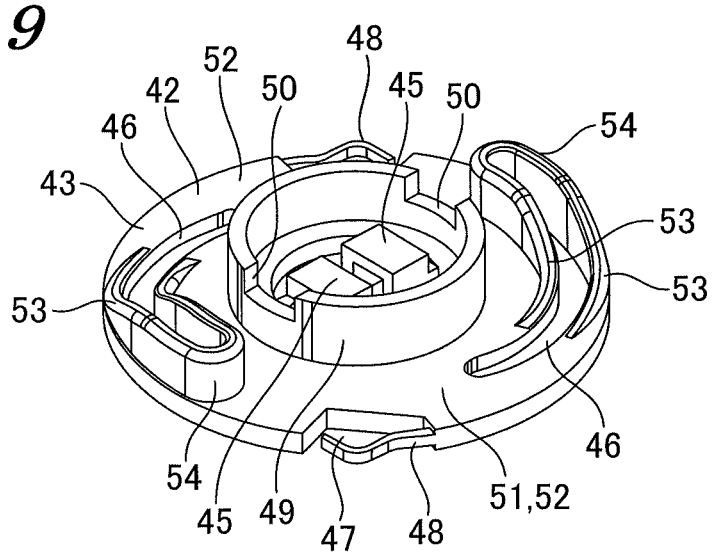

FIG. 9 is a perspective illustrative view schematically showing a first rotary driver and a first cam portion in an embodiment of a substrate storing container according to the present invention.

Figure 10:
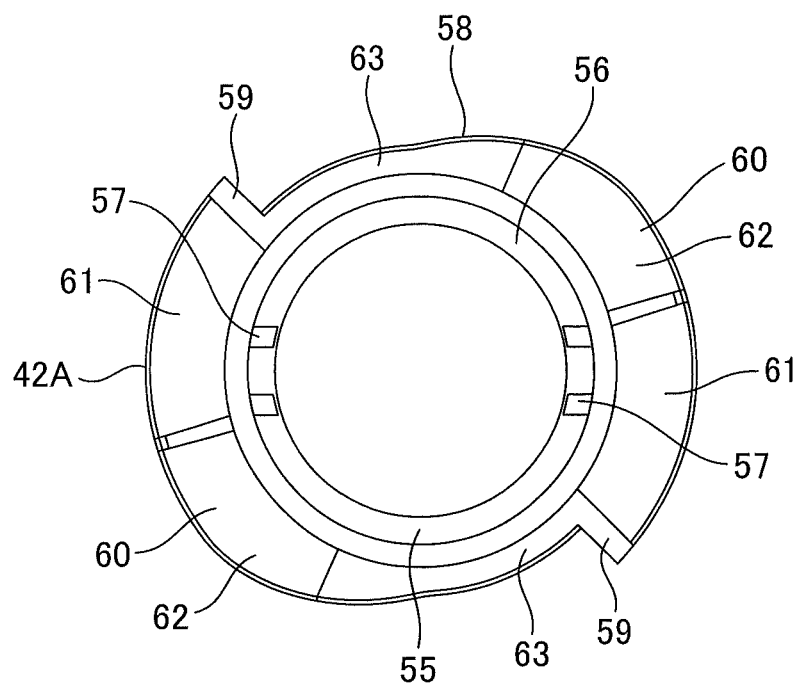

FIG. 10 is a front side illustrative view schematically showing a second rotary driver in an embodiment of a substrate storing container according to the present invention.

Figure 11:
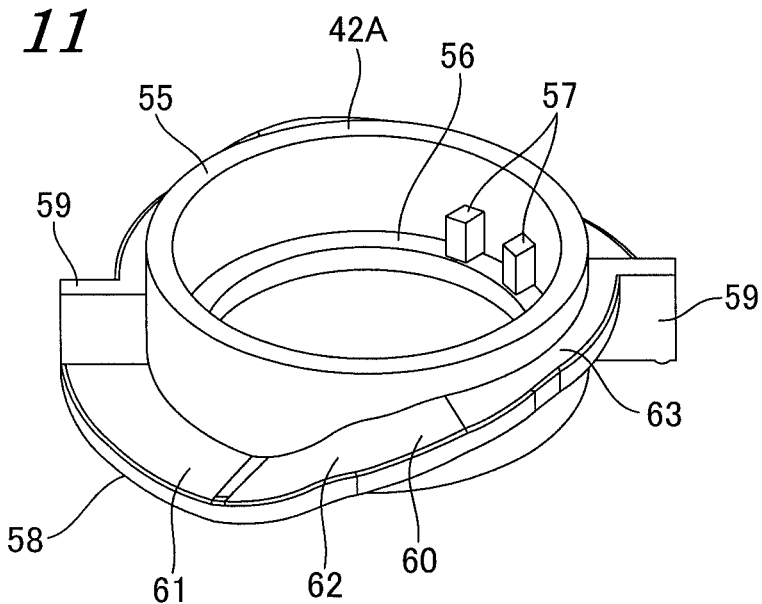

FIG. 11 is a perspective illustrative view schematically showing a second rotary driver and a second cam portion in an embodiment of a substrate storing container according to the present invention.

Figure 12:
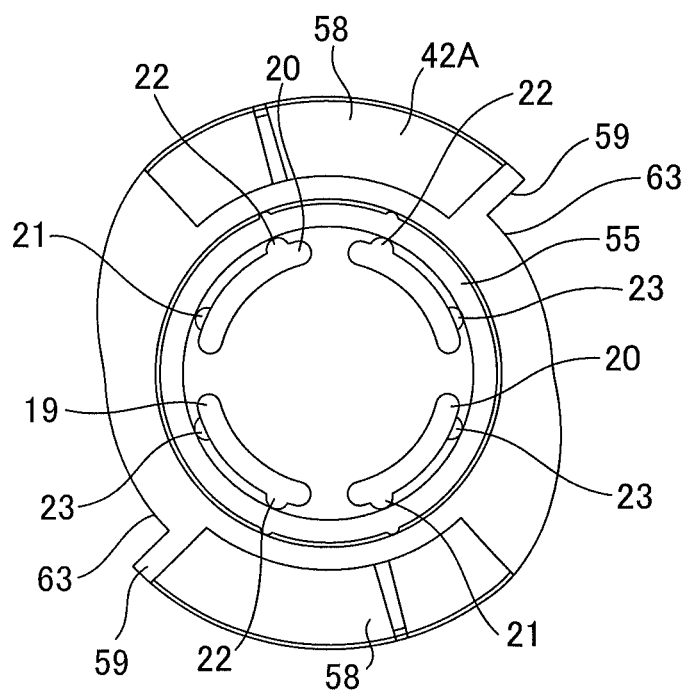

FIG. 12 is an illustrative view schematically showing first and second rotary drivers and positioning projections in an embodiment of a substrate storing container according to the present invention.

Figure 13:
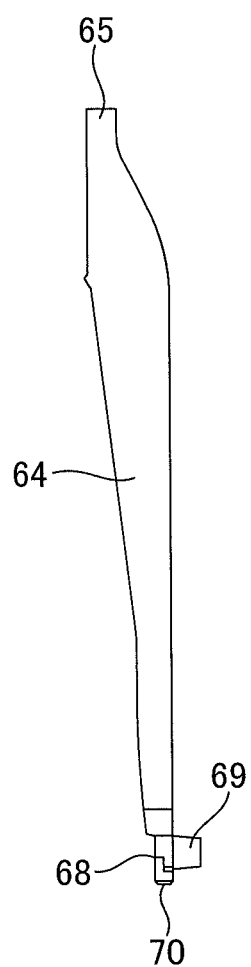

FIG. 13 is a side illustrative view schematically showing a locking bar in an embodiment of a substrate storing container according to the present invention.

Figure 14:
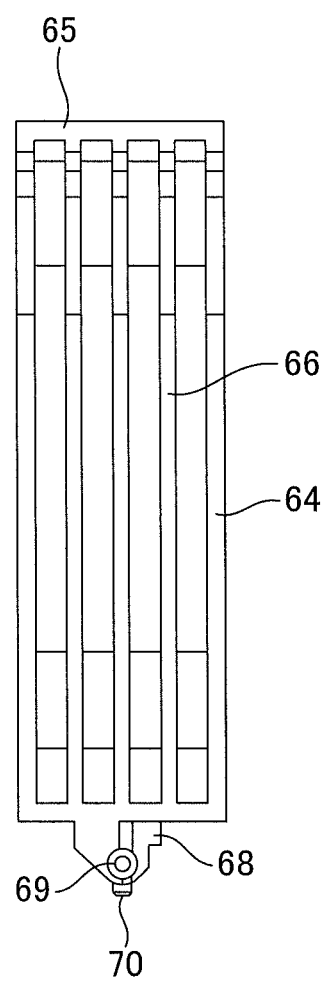

FIG. 14 is an illustrative plan view schematically showing a locking bar in an embodiment of a substrate storing container according to the present invention.

Figure 15:
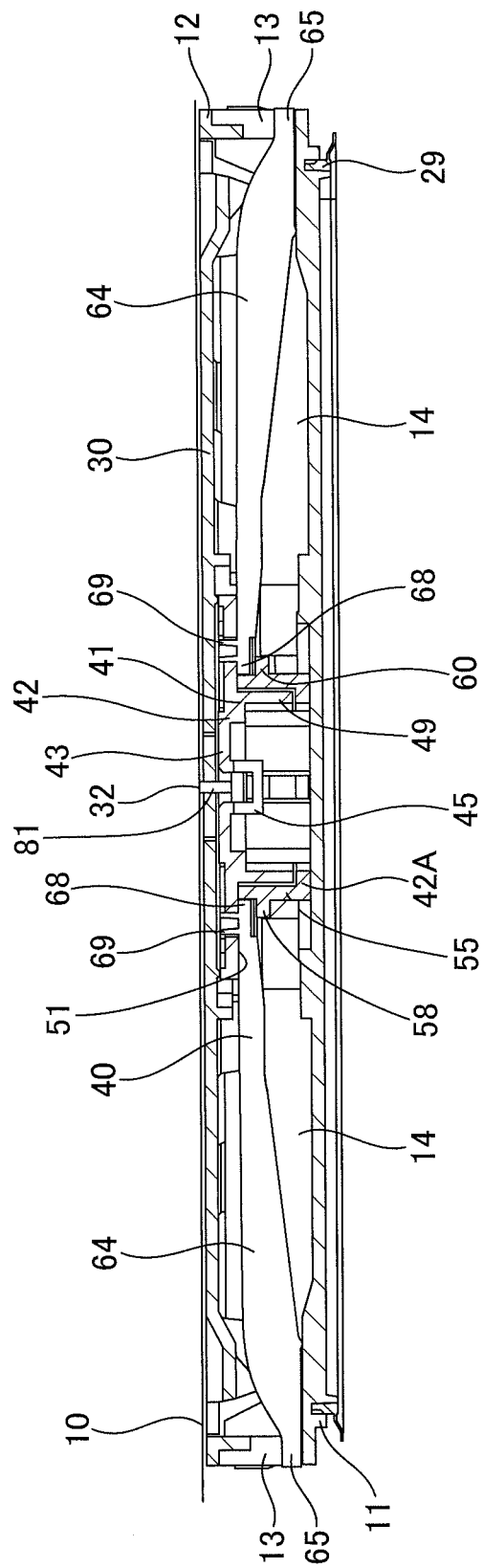

FIG. 15 is a sectional illustrative view schematically showing a door and a locking mechanism in an embodiment of a substrate storing container according to the present invention.

Figure 16:
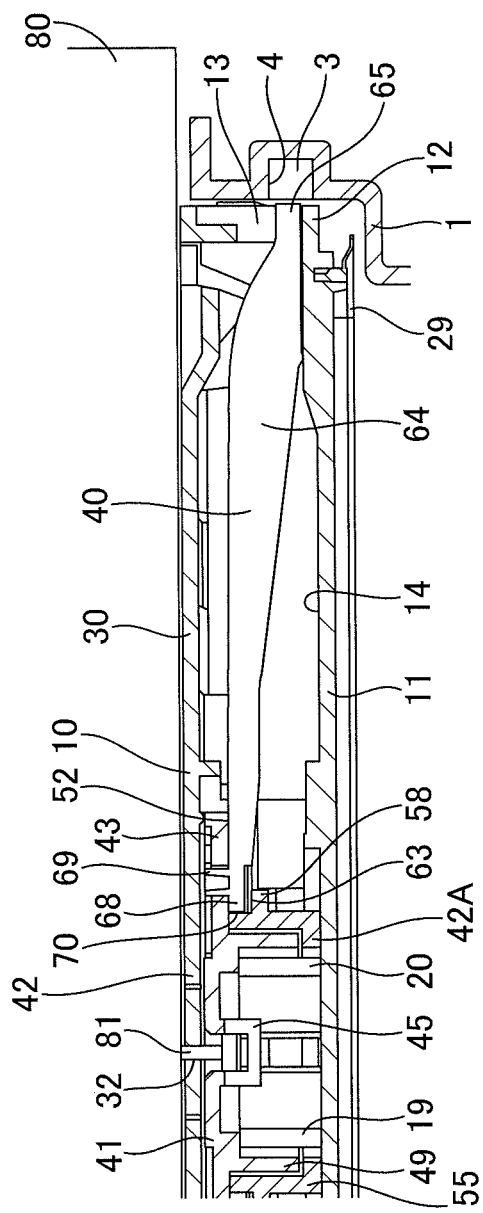

FIG. 16 is a partial sectional illustrative view schematically showing a state in which a door is shallowly fitted on the opening front of a container body in an embodiment of a substrate storing container according to the present invention.

Figure 17:
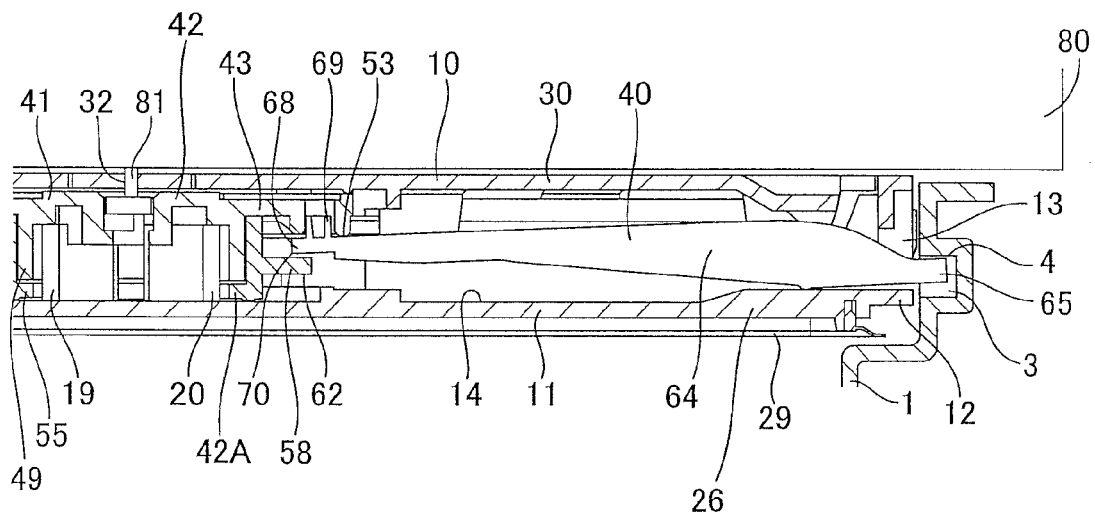

FIG. 17 is a partial sectional illustrative view schematically showing the first half stage at which the rotary driver for locking operation in the locking mechanism of FIG. 16 has been rotated 45 degrees in the locking direction.

Figure 18:
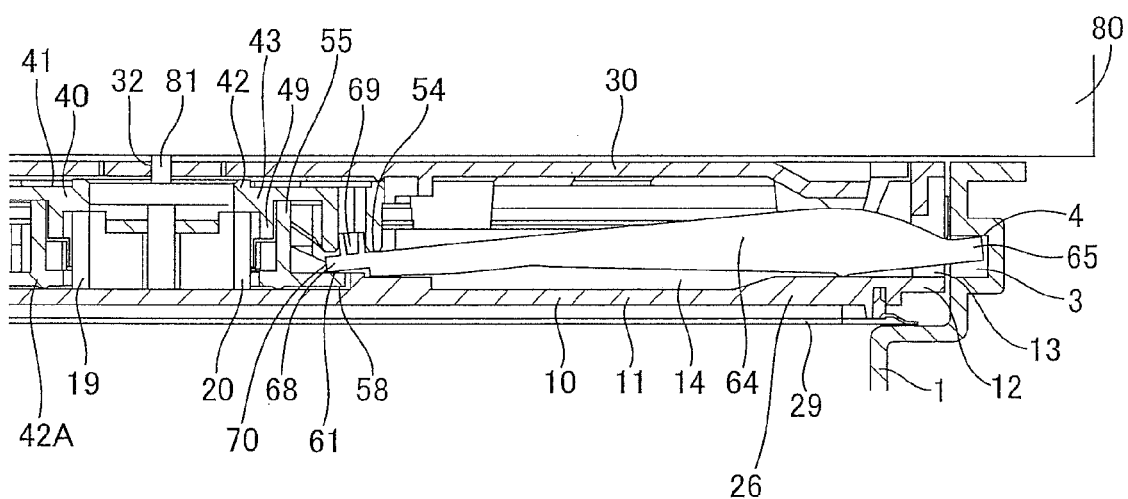

FIG. 18 is a partial sectional illustrative view schematically showing the second half stage at which the rotary driver for locking operation in the locking mechanism of FIG. 17 has been rotated 45 degrees in the locking direction.

Figure 19:
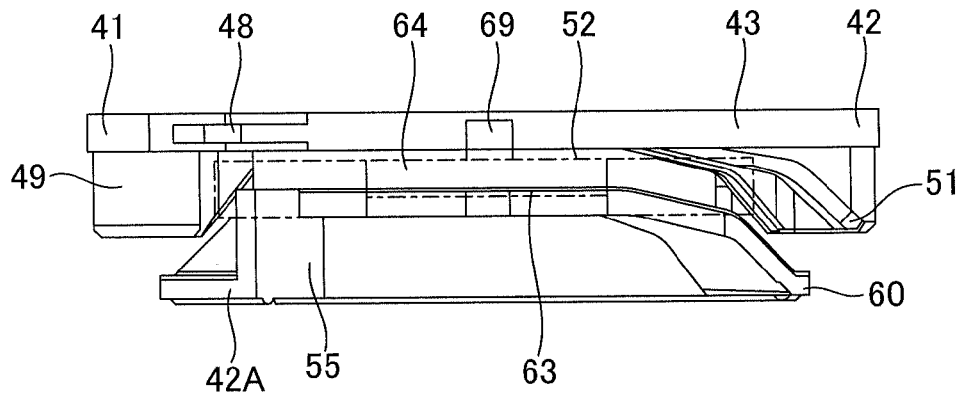

FIG. 19 is an illustrative view schematically showing the relationship of first and second cam portions with the locking bar in an embodiment of a substrate storing container according to the present invention.

Figure 20:
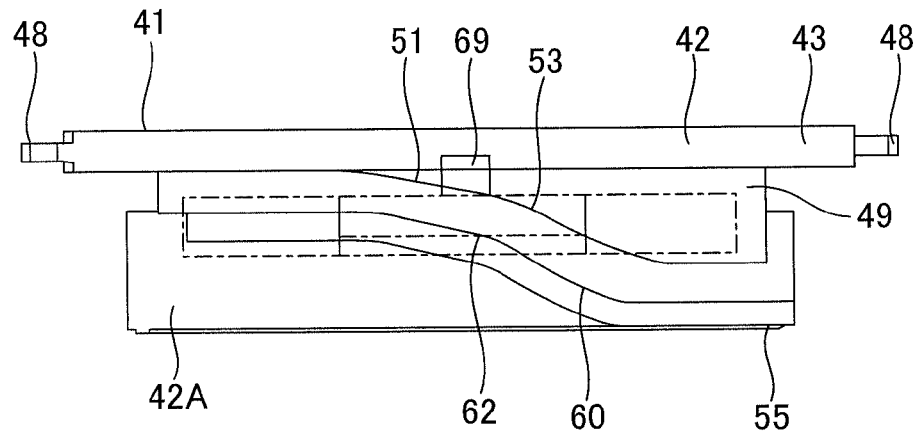

FIG. 20 is an illustrative view schematically showing the relationship of first and second cam portions with the locking bar when the rotary driver has been rotated 45 degrees in the locking direction in an embodiment of a substrate storing container according to the present invention.

Figure 21:
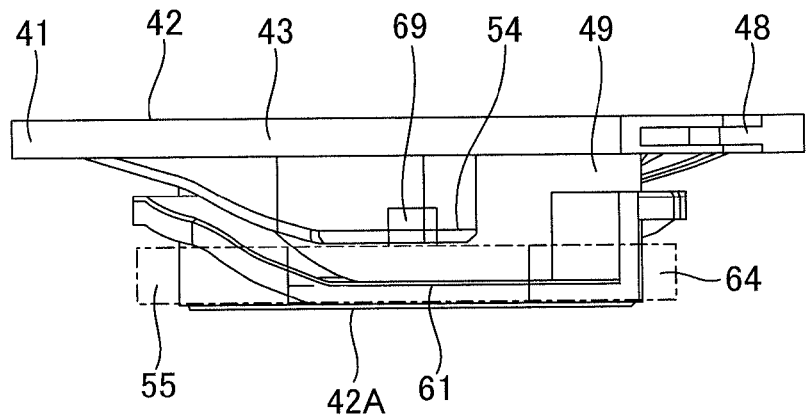

FIG. 21 is an illustrative view schematically showing the relationship of first and second cam portions with the locking bar when the rotary driver in FIG. 20 has been rotated 45 degrees in the locking direction.

Figure 22:
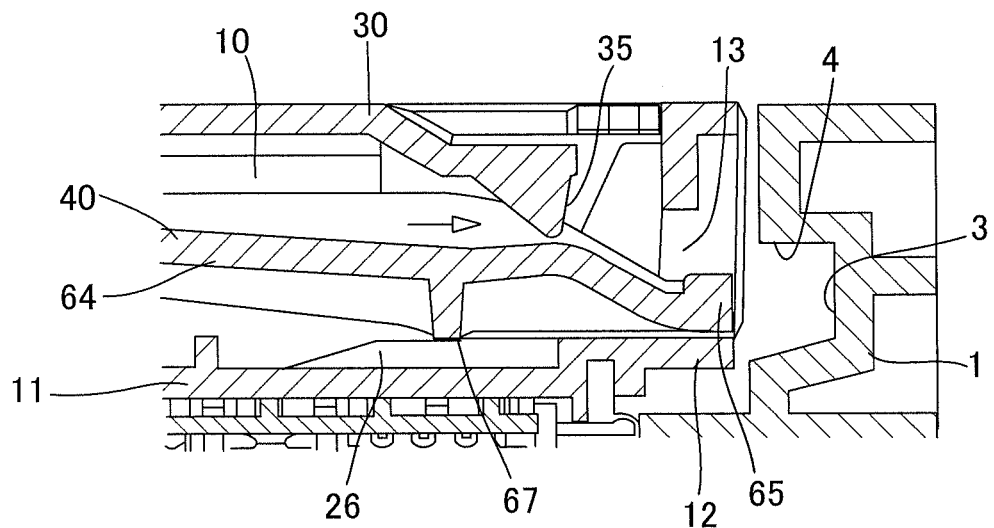

FIG. 22 is a sectional illustrative view schematically showing a state of the locking bar when a door is shallowly fitted on the opening front of a container body in an embodiment of a substrate storing container according to the present invention.

Figure 23:
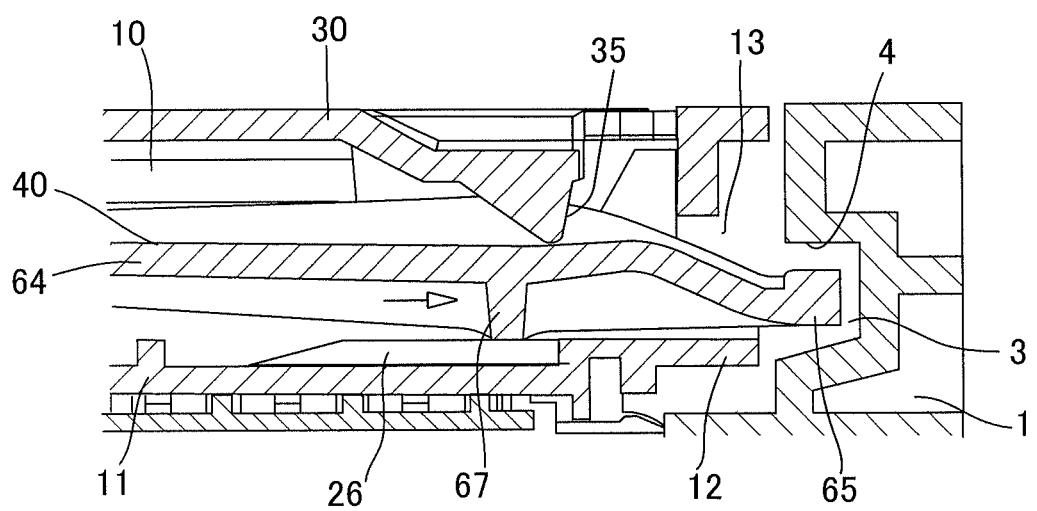

FIG. 23 is a sectional illustrative view schematically showing a state of the locking bar when the rotary driver for locking operation in the locking mechanism of FIG. 22 has been rotated 45 degrees in the locking direction.

Figure 24:
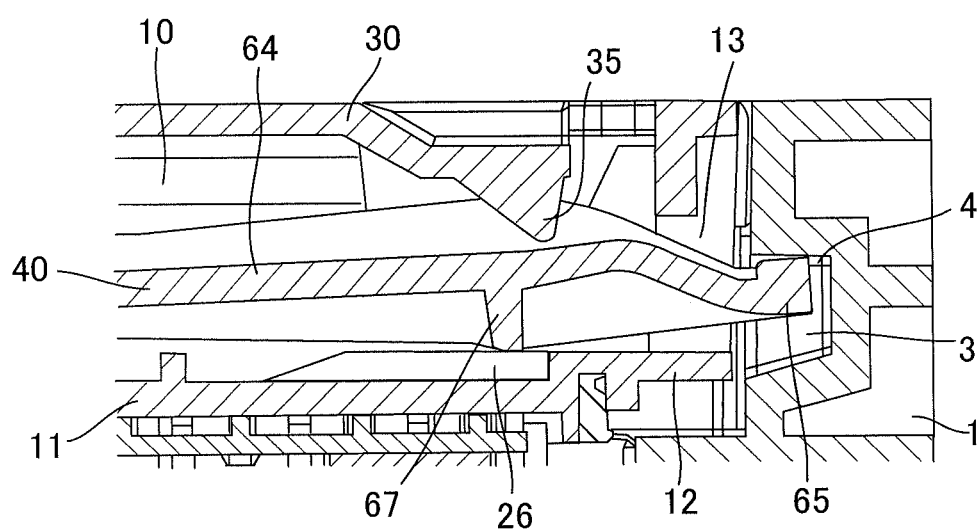

FIG. 24 is a sectional illustrative view schematically showing a state of the locking bar when the rotary driver for locking operation in the locking mechanism of FIG. 23 has been rotated 45 degrees in the locking direction.

MODE FOR CARRYING OUT THE INVENTION

Next, the embodiment of the present invention will be described with reference to the drawings. The substrate storing container in the present embodiment includes: as shown in FIGS. 1 to 24, a container body 1 for accommodating semiconductor wafers of silicon wafers having a diameter of, for example, 450 mm; a door 10 detachably fitted on the open front of this container body 1; and a locking mechanism 40 for locking door 10 fitted in the front of container body 1 by a two-step locking operation. Locking mechanism 40 has a rotary driver 41, which is parted into first and second rotary drivers 42 and 42A. These parts 42 and 42A are formed with multiple first and second cam portions 51 and 60, respectively, so that a locking bar 64 of locking mechanism 40 is interposed between first and second cam portions 51 and 60.

Container body 1, door 10 and locking mechanism 40 are constructed by assembling multiple parts, which are separately formed of molding materials containing predetermined resin by injection-molding. Examples of the resin contained in the molding materials may include thermoplastic resin such as polycarbonate, cycloolefin polymer, polyether imide, polyether ketone, polyether ether ketone, polybutylene terephthalate, polyacetal, and liquid crystal polymer, and alloys of these.

These resins are added with conductive components such as carbon fiber, carbon powder, carbon nanotubes, and conductive polymers, and anionic, cationic, nonionic and other various kinds of antistatic agents, as required. Further, UV absorbers of benzotriazole, salicylate, cyanoacrylate, oxalic acid anilide and/or hindered amine may be added. Glass fibers, carbon fibers and the like may be optionally added in order to improve rigidity.

As shown in FIG. 1, FIGS. 16 through 18 and FIGS. 22 through 24, container body 1 is formed of a front open box having a laterally long rectangular opening in the front while pairs of supporting pieces, each pair being formed on both sides inside the box, or on the interior left and right side walls, to horizontally support an unillustrated semiconductor wafer at its side periphery, are arranged vertically with a predetermined pitch. Each supporting piece is formed as a curved elongate plate extended in the front-to-rear direction.

A plurality of positioning supports are formed in the rear of the unillustrated supporting pieces in the rear part of the interior side walls of container body 1. Each positioning support is given in the form of a grooved recess, having an approximately V-shaped section and extended in the front-to-rear direction. This positioning support touches and positions the side periphery of the semiconductor wafer that is pushed inward inside container body 1 as door 10 is fitted and locked, and functions to horizontally support the semiconductor wafer slightly floating from the pair of supporting pieces.

Provided in both sides in the front and in the rear center on the underside of the baseplate of container body 1 are positioning tools that fit from top on the positioning pins of an unillustrated semiconductor processing machine. Attached to the underside of the baseplate of container body 1 is a bottom plate for sensing and fixture. On the top center of container body 1, a robotic flange 2 which is gripped by an unillustrated transfer system is removably attached.

As shown in FIGS. 16 through 18 and FIGS. 22 through 24, the front side with an opening of container body 1 is stretched out curvedly outwards while locking holes 3 for locking mechanism 40 are hollowed at both sides on the upper and lower sides of the inner peripheral surface. Each locking hole 3 has an approximately rectangular shape elongated in the lateral direction of container body 1. A distal end 65 of locking bar 64 moves, or specifically sways between the front-side wall surface 4 and the rear-side wall surface on the opposite side. The distal end 65 of locking bar 64 engages with locking hole 3, in contact with, at least, one of the wall surfaces that define locking hole 3.

As shown in FIGS. 1 through 4, FIGS. 15 through 18 and FIGS. 22 through 24, door 10 includes: an approximately tray shaped door main part 11 detachably fitted to the laterally long open front of container body 1; a cover plate 30 screw-fitted to the open front of the door main part 11 by means of multiple fasteners; and locking mechanism 40 assembled and built in between these door main part 11 and cover plate 30.

As shown in FIGS. 2 and 3 and FIGS. 22 through 24, door main part 11 basically includes a rectangular base plate with its four corner rounded and an approximately frame-shaped peripheral wall 12 circumferentially formed along the peripheral edge of the base plate. Bored through this peripheral wall 12 on the top and bottom sides are square retraction holes 13 opposing locking holes 3 of container body 1.

As shown in FIGS. 2 and 3, the interior of door main part 11 is divided into three sections having hollows and projections formed with the center section being high and the left and right sections being low and depressed. The depressed sections in both sides form mount spaces 14 for locking mechanism 40, each mount space 14 being formed with an enclosing rib 15 that encloses locking mechanism 40. This enclosing rib 15 is formed of a rotary driver-framing rib 16 formed in the center of mount space 14 and a plurality of locking bar-framing ribs 24 extending vertically and joining between retraction hole 13 of door main part 11 and rotary driver-framing rib 16 while a support rib 19 is arranged in the center inside rotary driver-framing rib 16 for supporting rotary driver 41 in a rotatable manner.

Rotary driver-framing rib 16 is divided in four circular arc ribs 17 rendering a ring in a plan view so as to enclose rotary driver 41 while these multiple circular arc ribs 17 are connected to locking bar-framing ribs 24 at their top-most and bottom-most positions. Multiple circular arc ribs 17 form sectioned spaces between neighboring circular arc ribs 17.

Support rib 19 is divided into four curved ribs 20 rendering a ring viewed in plan while neighboring curved ribs 20 form a sectioned space therebetween. A pair of positioning projections 21 having different lengths are integrally formed at both ends on the outer peripheral surface of each curved rib 20. Each positioning projection 21 is extended in the height direction of curved rib 20 (toward cover plate 30) and has an approximately semicircular section.

A pair of positioning projections 21 include a long positioning projection 22 having approximately the same length as the height of support rib 19 and a short positioning projection 23 having a length equal to or shorter than half the height of support rib 19, so as to function separately positioning and rotating first and second rotary drivers 42 and 42A.

Each locking bar-framing rib 24 has a pair of linear ribs 25 being arranged opposing, and apart from, each other so as to hold locking bar 64 therebetween, the distal ends of a pair of linear ribs 25 are joined to the vicinity of both edges of retraction hole 13 while the proximal ends of linear ribs 25 are joined to rotary driver-framing ribs 16. A plurality of guide ribs 26 approaching retraction hole 13 are arranged abreast between the distal ends of the pair of linear ribs 25, each guide rib 26 having a trapezoidal shape extended in the sliding direction of locking bar 64 so as to sway locking bar 64 in the thickness direction of door 10.

A pair of left and right front retainers 27 are detachably attached in both sides on the rear side of door main part 11 that opposes semiconductor wafers. Multiple elastic pieces 28 of each front retainer 27 deformably hold the front periphery of semiconductor wafers by their holding grooves and push the multiple semiconductor wafers inward to the back side of container body 1.

Formed along the periphery on the rear side of door main part is a frame-shaped attachment groove, to which an endless seal gasket 29 is press fitted. This seal gasket 29 is molded of, for example, silicone rubber, fluoro rubber or the like to have an elastically deformable frame-shape, and is compressed and deformed by being held between the inner periphery on the front of container body 1 and door 10, to provide a sealing function, or prevent the semiconductor wafers from being polluted by contact with the external air.

Cover plate 30, as shown in FIGS. 1, 2 and 4, is given in the form of an approximately rectangular-shaped plate corresponding to the open front of door main part 11 while a plurality of elongate washing holes 31 for passing washing water are radially formed in the center area. In the center on left and right side of this cover plate 30, a pair of vertically long rectangular key slots 32 for locking mechanism 40 are perforated so that each key slot 32 is inserted by an operation key 81 of door opening and closing equipment 80 in a rotatable manner.

As shown in FIG. 4, endless mating ribs 33 opposing rotary driver-framing ribs 16 of enclosing ribs 15 are circumferentially formed on the left and right sides on the back side of cover plate 30 around the center while part of each mating rib 33 is bent in an approximately angle-bracket shape to from a pair of rotation limiters 34 as a rotation limiting member. On the back side of cover plate 30, triangular projections 35 are formed on both the upper and lower sides, above and below key slots 32. Each triangular projection 35 is formed so as to be inclined and gradually tapered as it approaches door main part 11.

As shown in FIG. 2 and FIGS. 5 through 12, locking mechanism 40 includes: a pair of left and right rotary drivers 41, which each are rotatably fitted and supported on support rib 19 in mount space 14 and rotated from the outside of cover plate 30; and a plurality of locking bars 64 that each slide in the vertical direction in mount space 14 so as to bring distal end 65 into, and out of, locking hole 3 of container body 1 as rotary driver 41 rotates. When rotary driver 41 is turned in the locking direction to lock door 10, distal end 65 of locking bar 64 is projected from retraction hole 13 of door 10 into locking hole 3 of container body 1 without any contact, thereafter, locking bar 64 is swayed to the cover plate 30 side of door 10 so that the distal end 65 comes into contact with the front-side wall surface 4 of locking hole 3.

Each rotary driver 41 is divided into two opposing parts, first and second rotary drivers 42 and 42A, as shown in FIGS. 2 and 5. Formed on the opposing sides of first and second rotary drivers 42 and 42A are a plurality of first and second cam portions 51 and 60 forming three-dimensional cams. First and second cam portions 51 and 60 are arranged opposing each other and made apart an approximately constant gap therebetween, and holds the proximal end of locking bar 64 so as to prevent locking bar 64 from easily dislodging.

As shown in FIGS. 5 through 9, first rotary driver 42 is formed of a disc 43 that is enclosed by rotary driver-framing rib 16 in mount space 14 and arranged to oppose cover plate 30, and a cylindrical rib 49 provided upright on disc 43 in the center on the side opposing second rotary driver 42A. Formed near the end on the peripheral wall of this cylindrical rib 49 are a pair of positioning cutouts 50 opposing each other or 180° apart, each positioning cutout 50 being formed in a square shape as the first positioning portion.

Disc 43 is bored with a rectangular operation hole 44 to which an operation key 81 of door opening and closing equipment 80 is fitted through key slot 32. Around the center in the opposing side that opposes second rotary driver 42A, a pair of socket ribs 45 for receiving operation key 81 fitted through operation hole 44 are formed and arranged apart from each other, each socket rib 45 being formed by bending so as to have an approximately U-section.

Near the periphery of disk 43, a pair of circular arc slots 46 for sliding locking bars 64 are cut through 180° apart from each other. A pair of depressed portions 47 are formed adjacent to circular arc slot 46 by cutting out inwardly 180° apart from each other in the periphery of disc 43 as engaging portions while a flexible and approximately hook-shaped position adjustor 48 is projected in circumferential direction near the boundary between the periphery of disc 43 and each depressed portion so as to enclose depressed portion 47. These paired position adjustors 48 are engaged with rotation limiters 34 of cover plate 30 to thereby control rotation of rotary driver 41.

Cylindrical rib 49 is rotatably fitted on multiple curved ribs 20 forming support rib 19 with its inner peripheral surface coming in contact with long positioning projections 21 only without being in contact with short positioning projections 23, among multiple positioning projections. Accordingly, first rotary driver 42 can rotate greater in the horizontal direction than in vertical direction in FIG. 12, so that if, for example, operation hole 44 is more or less displaced from the normal position relative to operation key 81 of door opening and closing equipment 80, operation hole 44 may follow operation key 81 and make it fit therein.

As shown in FIG. 9 and others, each first cam portion 51 is formed of a first flat cam 52 that is formed on the opposing surface of disc 43, a first inclined cam 53 that is partially formed upright on both peripheral sides of circular arc slot 46 and becomes gradually higher from the first end to the second end of circular arc slot 46 and a first engaging cam 54 that is formed upright near the periphery of the second end of circular arc slot 46 and integrated with first inclined cam 53.

First flat cam 52 is located to be flat between circular arc slot 46 and depressed portion 47 and adjacent to the first end of circular arc slot 46. First inclined cam 53 is formed of a pair of curved, approximately triangular walls that oppose each other sandwiching circular arc slot 46 with its lowest position located in the middle of circular arc slot 46 near the position of its point of flexion and its highest point located near and before the vicinity of the second end of circular arc slot 46. First engaging cam 54 is formed by a wall that encloses the second end of circular arc slot 46 and has an approximately U-shaped section with the same height as the highest part of first inclined cam 53 so as to be smoothly connected to first inclined cam 53 as being flush with the highest part thereof.

Second rotary driver 42A, as shown in FIG. 2, FIGS. 5 through 7, FIGS. 10 through 12 and others, is formed of a cylindrical rib 55 fitted externally on cylindrical rib 49 of first rotary driver 42 and outside flanges 58 radially projecting from the outer peripheral surface of this cylindrical rib 55, and disposed on the door main part 11 side. A pair of partitioning walls 59 that define two outside flanges 58 are arranged 180° apart from each other and projectively formed on the outer peripheral surface of cylindrical rib 55. The pair of outside flanges 58 divided by this pair of partitioning walls 59, each form a three-dimensional, second cam portion 60.

Cylindrical rib 55 has an annular inside flange 56 formed on the inner peripheral surface at one open end located on the door main part side 11. Plural pairs of positioning ribs 57, each pair of the ribs being arranged side by side apart from each other in the circumferential direction, are formed. One pair of positioning ribs 57 are arranged opposing another pair of positioning ribs 57 (see FIG. 10).

These multiple positioning ribs 57 position and fit in positioning cutouts 50 of first rotary driver 42 as the second positioning portion and function to rotate first and second rotary drivers 42 and 42A together. Each positioning rib 57 is formed as a bar shorter than the height of cylindrical rib 55, closely attached to the inner peripheral surface of cylindrical rib 55 and extended in the height direction of cylindrical rib 55 from inside flange 56 to approximately half the height.

As inside flange 56 comes in contact with the distal end of the peripheral wall of cylindrical rib 49 of first rotary driver 42, differing from cylindrical rib 49, inside flange 56 comes in contact with multiple positioning projections 21, more specifically, all the projections, long positioning projections 22 and short positioning projections 23, so that the rotation of cylindrical rib 55 is regulated so as to be substantially perfect circular. Accordingly, differing from first rotary driver 42, second rotary driver 42A is regulated to rotate uniformly both in the vertical and horizontal directions in FIG. 12.

As shown in FIGS. 10 and 11, each second cam portion 60 is formed of a second flat cam 61 that is formed horizontally on the one end side of outside flange 58 and connected to one end of partitioning wall 59, a second inclined cam 62 that is connected to the end of second flat cam 61 and extended toward the other partitioning wall 59 gradually changing its height and a second engaging cam 63 that is formed on the other end side of outside flange 58 and formed continuously between the end of second inclined cam 62 and the other end of the other partitioning wall 59.

In the second half stage of the locking operation of locking mechanism 40, second flat cam 61 opposes first engaging cam 54 of first cam portion 51 to hold the proximal end of locking bar 64 therebetween. First inclined cam 62 and second engaging cam 63 are formed in such a relationship that the protruding amount becomes gradually smaller as it goes from second inclined cam 62 to second engaging cam 63. Part of second inclined cam 62 opposes part of first inclined cam 53 of first cam portion 51 to hold the proximal end of locking bar 64 therebetween in the first half stage of the locking operation of locking mechanism 40. Further, second engaging cam 63 opposes first flat cam 52 of first cam portion 51 to hold the proximal end of locking bar 64 therebetween in the stage before the locking operation.

As shown in FIGS. 13 through 15 and FIGS. 22 through 24, each locking bar 64 is basically given in the form of an approximately rectangular plate, and is slidably accommodated inside locking bar-framing ribs 24 in mount space 14, or specifically, between a pair of linear ribs 25, and distal end 65 having a square shape projects out from retraction hole 13 of door 10 and functions as a locking claw that fits into locking hole 3 of container body 1 when door 10 is locked.

The front face of locking bar 64 opposing cover plate 30 is formed with distal end 65 being flat, the close-to-distal end in a curve and the part from the close-to-distal end to the proximal end inclined to become gradually thinner. In contrast, the back side of locking bar 64 opposing door main part 11 is formed with the part from the close-to-distal end to the proximal end gently inclined to become thinner. The thus formed locking bar 64 is thick in distal end 65, thickest in the close-to-distal end and becomes gradually thinner from the close-to-distal end to the proximal end.

Formed on the front side of locking bar 64 are a plurality of reinforcing ribs 66 longitudinally extended and arranged abreast. Triangular projections 35 of cover plate 30 are always fitted loosely without contact between these multiple reinforcing ribs 66. These triangular projections 35 closely located effectively prevent locking bar 64 from wobbling, being displaced due to impact at the time of falling and others. Further, the close-to-front part on the back side of locking bar 64 is projectively formed with a tapering support point 67 having an approximately trapezoidal section as shown in FIG. 22 to the end. The distal end of this support point 67 comes in slidable contact with guide ribs 26 on door main part 11.

Integrally formed at the center of the proximal end of locking bar 64 is an attachment piece 68. On this attachment piece 68, an engaging part that is loosely fitted in circular arc slot 46 of first rotary driver 42 in a slidable and swayable manner from the second rotary driver 42A side, namely, a fitting pin 69, is planted via a rib while an abutment 70 that opposes the outer peripheral surface of cylindrical rib 55 is formed.

The proximal end, attachment piece 68 and fitting pin 69 of locking bar 64 are swayably held between first and second cam portions 51 and 60 so that these first and second cam portions 51 and 60 transmit swaying movement in the thickness direction of door 10. Fitting pin 69 is formed of cylindrical shape or columnar shape in view of assuring smooth contact with circular arc slot 46, and moves between first and second cam portions 51 and 60 at the time of locking door 10.

Here, fitting pin 69 divides attachment piece 68 into two parts. One part of attachment piece 68 is formed thinner than the other part of attachment piece 68 in view of ease of loose insertion of fitting pin 69 into circular arc slot 46 and avoiding interface therebetween.

In the above configuration, in assembling locking mechanism 40 and setting the assembly in door 10, first the proximal ends of a pair of locking bars 64 are held between first and second rotary drivers 42 and 42A via first and second cam portions 51 and 60 while fitting pin 69 of locking bar 64 is inserted into each circular arc slot 46 of first rotary driver 42 to thereby assembly locking mechanism 40. This locking mechanism 40 is fitted in a pair of enclosing ribs 15 of door 10 and rotary driver 41 is fitted and held in a rotatable manner on support rib 19 of each enclosing rib 15, whereby it is possible to set the assembled locking mechanism 40 in door 10.

Next, when door 10 is fitted and locked to the open front of container body 1 in which a plurality of semiconductor wafers are being stored in alignment, door 10, which has been suctioned and held by door opening and closing equipment 80, is shallowly fitted to the open front of container body 1 first so that the cover plate 30 side of door 10 is more or less projected outside from the front of container body 1 (see FIGS. 16 and 22).

Since, upon this, locking mechanism 40 is not locked though door opening and closing equipment 80 fits door 10 shallowly, the proximal end of each locking bar 64 is held between first flat cam 52 of first cam portion 51 and second engaging cam 63 of second cam portion 60, so that the proximal end of this locking bar 64 is located on the cover plate 30 side of door 10. As the proximal end is positioned on the cover plate 30 side of door 10 in the above way, distal end 65 is located on the door main part 11 side, hence locking bar 64 is postured with the imaginary line joining distal end 65 and the proximal end oriented obliquely downward in FIG. 16.

Next, as operation key 81 of door opening and closing equipment 80 is inserted through key slot 32 of cover plate 30 to enter operation hole 44 of first rotary driver 42 and rotary driver 41 rotates by an rotational angle of 45° in the locking direction, fitting pin 69 of locking bar 64, loosely fitted in circular art slot 46, moves between first and second cam portions 51 and 60 while the proximal end of locking bar 64 is held at a position halfway between first inclined cam 53 of first cam portion 51 and second inclined cam 62 of second cam portion 60.

Then, locking bar 64 moves in the direction toward the peripheral wall 12 of door 10 with its support point 67 sliding along guide ribs 26 of door 10 to project out distal end 65 from retraction hole 13. This projected distal end 65 plunges without contact into locking hole 3 of container body 1 more deeply than the prior art configuration (see FIGS. 17 and 23).

During this, even if operation hole 44 does not oppose operation key 81 correctly, first rotary driver 42 can rotate greater in the lateral direction than in the vertical direction, so that operation hole 44 follows operation key 81 and easily allows the key to fit therein, hence it is possible to avoid the operation being interrupted due to occurrence of trouble.

Further, as apparent from comparison between FIGS. 16 and 17, the proximal end of locking bar 64 is supported to the lower side along second inclined cam 62 of second cam portion 60, so that distal end 65 is slightly swayed upward and positioned. Thus, distal end 65 is oriented slightly upward, whereby the inclination of locking bar 64 is alleviated compared to FIG. 16 though the imaginary line joining distal end 65 and the proximal end is still oriented downward.

Next, when operation key 81 of door opening and closing equipment 80 further turns rotary driver 41 by a rotational angle of 45° in the locking direction so that rotary driver 41 rotates 90° in total, fitting pin 69 of locking bar 64 that is loosely fitted in circular arc slot 46 moves between first and second cam portions 51 and 60 while the proximal end of locking bar 64 is held between first engaging cam 54 of first cam portion 51 and second flat cam 61 of second cam portion 60.

As a result, as locking bar 64 further moves in the direction toward the peripheral wall 12 of door 10 with its support point 67 sliding along guide ribs 26 of door 10, the locking bar sways to the cover plate 30 side about the contact between support point 67 and guide ribs 26 as a fulcrum so that distal end 65 comes into pressing contact with front-side wall surface 4 (see FIGS. 18 and 24). This pressing contact causes door 10 fitted shallowly inside the front of container body 1 to be drawn deeply, whereby door 10 can be fitted and locked appropriately and firmly.

During this, locking bar 64 is moved about guide ribs 26 of door 10 as a fulcrum so that the proximal end is displaced to the door main part 11 side by means of first engaging cam 54 of first cam portion 51 and second flat cam 61 of second cam portion 60. As a result, distal end 65 is positioned more upward than the position shown in FIG. 17. In this way, as distal end 65 is oriented upward, locking bar 64 takes a posture such that the imaginary line joining distal end 65 and the proximal end is oriented obliquely upward.

Here, a rotary driver 41 turns 90°, operation hole 44 of first rotary driver 42 is positioned parallel to key slot 32 of cover plate 30, so that operation key 81 of door opening and closing equipment 80 can be smoothly pulled out from operation hole 44. Further, as door 10 is fitted and locked, the semiconductor wafers supported by pairs of left and right supporting pieces are pushed to the back side inside container body 1 by pressing and holding of front retainers 27.

When locking mechanism 40 of door 10 that have been fitted in the front of container body 1 is unlocked to remove door 10, door 10 is suctioned and held by door opening and closing equipment 80, then the reverse procedures as the above procedures are carried out. In this case, in locking mechanism 40, as rotary driver 41 turns in the unlocking direction or in the direction opposite to the locking direction, locking bar 64 sways from the cover plate 30 side to the door main part 11 side so as to move distal end 65 from the front-side wall surface 4 of locking hole 3 toward the backside wall surface, then distal end 65 of locking bar 64 is retracted without contact from locking hole 3 into retraction hole 13 of door 10.

According to the above configuration, first and second rotary drivers 42 and 42A hold locking bar 64 from both the front and rear sides via first and second cam portions 51 and 60, so that it is possible to provide a structure that makes locking bar 64 unlikely to dislodge. As a result, it is possible to prevent semiconductor wafers from being damaged and/or polluted due to inflow of air from the outside even if a strong impact acts on locking mechanism 40 from falling or other reasons and locking mechanism 40 is unlocked.

Further, since distal end 65 of locking bar 64 plunges more deeply than the conventional configuration into locking hole 3 of container body 1 and then sways to the cover plate 30 side of door 10 to come into contact with the front-side wall surface 4 of locking hole 3 and draw in door 10 deeply, it is possible to stabilize the locking operation without any risk of damaging distal end 65 of locking bar 64 and locking hole 3 and still assure a sufficient distance to draw in door 10. Moreover, since distal end 65 of locking bar 64 projects out into locking hole 3 of container body 1 without any contact, there is no fear of particles being generated due to friction and distal end 65 of locking bar 64 being deformed even if, for example, an excessive locking force acts on locking mechanism 40.

Still more, since locking bar 64 only needs to be held between first and second rotary drivers 42 and 42A, it is possible to avoid the relationship between first and second rotary drivers 42 and 42A and locking bar 64 being complicated. Accordingly, first and second rotary drivers 42 and 42A and locking bar 64 can be easily formed with high precision, so that neither delay nor complexity will occur in assembly work of locking mechanism 40. Further, since no locking claws are needed for locking mechanism 40, it is possible to reduce parts in number and assemble locking mechanism 40 quickly.

Further, since strength degradation of retraction hole 13 from use of a pivotal support of locking claws can be avoided, it is possible to eliminate the fear of door 10 being deformed so as to enlarge the opening of retraction hole 13 at the time of locking and/or locking bar 64 being deformed. Since it is also possible to omit locking claws and metallic pins for insertion, speedy assembly work can be greatly expected.

Since a pair of positioning projections 21 allow first rotary driver 42 to rotate in the lateral direction and thereby enable operation key 81 to follow operation hole 44 that is out of position, it is possible to avoid stoppage of operation due to trouble at the time of automatic opening and closing of door 10, hence expect sharp improvement in productivity. Moreover, since dimensional error can be also absorbed, it is possible to prevent generation of particles due to rubbing between operation key 81 and operation hole 44.

Herein, the container body 1 in the above embodiment may have grip means for manual operation and side rails for transportation and the like attached as appropriate, on the external face of the side wall thereof. Further, door main part 11 and the inner peripheral surface of any of circular arc ribs 17 may be formed with a necessary number of rotation limiters 34. Separately from mating ribs 33, rotation limiters 34 may also be formed in cover plate 30. Moreover, though guide ribs 26 are preferably formed in mount space 14 of door main part 11, it is also possible to form them on the rear side of cover plate 30 as long as they will not be a particular hindrance. Furthermore, fitting pin 69 of each locking bar 64 may be fitted with a rotatable roller in view of protection against wear-out.

INDUSTRIAL APPLICABILITY

The substrate storing container according to the present invention can be used in the manufacturing field of semiconductors, liquid crystals and the like.

DESCRIPTION OF REFERENCE NUMERALS 1 container body
3 locking hole (locking hollow)
4 front-side wall surface (wall surface on the opening side)
10 door
11 door main part
12 peripheral wall
13 retraction hole
15 enclosing rib
16 rotary driver-framing rib
19 support rib (supporting member)
21 positioning projection
22 long positioning projection
23 short positioning projection
24 locking bar-framing rib
25 linear rib
26 guide rib (guiding projection)
30 cover plate
32 key slot
34 rotation limiter (rotation limiting member)
35 triangular projection
40 locking mechanism
41 rotary driver
42 first rotary driver
42A second rotary driver
43 disc
44 operation hole
46 circular arc slot (engaging portion)
48 position adjustor
49 cylindrical rib (cylindrical member)

50 positioning cutout (first positioning portion)
51 first cam portion
52 first flat cam (first flat cam surface)
53 first inclined cam (first inclined cam surface)
54 first engaging cam (first engaging cam surface)
55 cylindrical rib (cylindrical member)
56 inside flange
57 positioning rib (second positioning portion)
58 outside flange
60 second cam portion
61 second flat cam (second flat cam surface)
62 second inclined cam (second inclined cam surface)
63 second engaging cam (second engaging cam surface)
64 locking bar
65 distal end
66 reinforcing rib
67 support point
69 fitting pin (fitting portion)
80 door opening and closing equipment
81 operation key

The invention claimed is:

1. A substrate storing container comprising:
a container body for storing substrates;
a door that is fitted to an opening of the container body; and
a locking mechanism for locking the door fitted to the opening of the container body, wherein
the locking mechanism includes a rotary driver that is operated from an outside of the door and a locking bar that slides as the rotary driver rotates to bring a distal end into and out of a locking hollow in an inner periphery of the opening of the container body,
the rotary driver has a three-dimensional cam to support the locking bar in a swayable manner,
the three-dimensional cam has first and second three-dimensional cam portions which are opposite to each other and made apart with an approximately constant gap regarding a thickness direction of the door therebetween,
the locking bar is held by the gap,
when the door is locked, the rotary driver is rotated in a locking direction to cause the first and second three-dimensional cam portions to follow the locking bar so as to project the distal end of the locking bar out of the door into the locking hollow of the container body in a substantially non-contacting manner and then move the locking bar in the thickness direction of the door, thereby bringing the distal end into contact with a wall surface forming the locking hollow,
the first three-dimensional cam portion has a first inclined cam surface gradually going toward the thickness direction of the door as the first inclined cam surface goes toward the locking direction, and
the second three-dimensional cam portion has a second inclined cam surface gradually going toward the thickness direction of the door as the second inclined cam surface goes toward the locking direction.

2. The substrate storing container according to claim 1, wherein
the door includes: a door main part fitted to the opening of the container body; and a cover plate that covers an opening side of the door main part, and a rotation limiting member for the rotary driver of the locking mechanism is provided either on the door main body or the cover plate, and a retraction hole for the locking bar that opposes the locking hollow of the container body is formed on a peripheral wall of the door main part.

3. The substrate storing container according to claim 2, wherein
the door is built in with a guiding projection for the locking bar of the locking mechanism while a support point is formed in the locking bar at a position opposing a guiding projection, and the distal end of the locking bar is tilted in the thickness direction of the door, using the contact point between the guiding projection and support point as a fulcrum.

4. The substrate storing container according to claim 2, wherein
the door main body of the door is formed with a supporting member for supporting the rotary driver, and a positioning projection is formed on the peripheral surface of the supporting member.

5. The substrate storing container according to claim 4, wherein
the rotary driver is built in the door main body of the door and has an operation hole formed in a center opposing to the cover plate so as to oppose a key slot of the cover plate,
the rotary driver has an engaging portion for the locking bar, the engaging portion being provided along the three-dimensional cam,
a proximal end of the locking bar is held between the first and second three-dimensional cam portions in a swayable manner, and
a fitting portion which is slidably fitted to the engaging portion is provided at the proximal end of the locking bar.

6. The substrate storing container according to claim 5, wherein
the first three-dimensional cam portion includes: a first flat cam surface that is adjacent to the engaging portion; the first inclined cam surface that is formed along the peripheral side of the engaging portion and becomes gradually higher from one end to other end of the engaging portion; and a first engaging cam surface formed in a vicinity of other end of the periphery of the engaging portion and integrated with the first inclined cam surface,
the first cam three-dimensional portion is formed in such a manner that a lowest portion of the first inclined cam surface is positioned in a vicinity of a point of flexion of the engaging portion while a highest point is positioned in a vicinity of the other end of the engaging portion, and the first engaging cam surface is formed to have approximately the same height as height of a highest portion of the first inclined cam surface, and
the second three-dimensional cam portion includes: a second flat cam surface; the second inclined cam surface that is connected to the end of the second flat cam surface and gradually changes in height as it goes in the circumferential direction of the rotary driver; and a second engaging cam surface that is formed on the other end side of the outside flange and formed contiguous to the end of the second inclined cam surface, and wherein the second three-dimensional cam portion gradually goes toward a direction of a center of the rotary driver as it goes from the second inclined cam surface to the second engaging cam surface.

* * * * *